(12) United States Patent
Moteki

(10) Patent No.: US 10,216,886 B2
(45) Date of Patent: Feb. 26, 2019

(54) SEMICONDUCTOR DEVICE AND METHOD FOR DESIGNING A SEMICONDUCTOR DEVICE

(71) Applicant: MegaChips Corporation, Osaka (JP)

(72) Inventor: Daiki Moteki, Chiba (JP)

(73) Assignee: MegaChips Corporation, Osaka (JP)

( * ) Notice: Subject to any disclaimer, the term of this patent is extended or adjusted under 35 U.S.C. 154(b) by 49 days.

(21) Appl. No.: 15/668,346

(22) Filed: Aug. 3, 2017

(65) Prior Publication Data
US 2017/0357745 A1 Dec. 14, 2017

Related U.S. Application Data

(62) Division of application No. 14/670,972, filed on Mar. 27, 2015, now Pat. No. 9,754,066.

(30) Foreign Application Priority Data

Mar. 28, 2014 (JP) .................. 2014-069125

(51) Int. Cl.
*G06F 17/50* (2006.01)
*H01L 23/00* (2006.01)
(Continued)

(52) U.S. Cl.
CPC ...... *G06F 17/5077* (2013.01); *G06F 17/5072* (2013.01); *G06F 17/5081* (2013.01);
(Continued)

(58) Field of Classification Search
CPC ............. G06F 17/5072; G06F 17/5077; H01L 23/481; H01L 23/5286; H01L 23/50; H01L 2924/0002
(Continued)

(56) References Cited

U.S. PATENT DOCUMENTS 4,947,229 A * 8/1990 Tanaka .................. H01L 23/528
257/207
5,633,807 A 5/1997 Fishburn et al.
(Continued)

FOREIGN PATENT DOCUMENTS

JP          63-152144 A      6/1988
JP          2000-82743 A     3/2000
(Continued)

OTHER PUBLICATIONS

Mutsunori et al., Machine English Translation of Japanese Patent Document No. JP-2000-082743, Published Mar. 21, 2000, Machine Translated on Nov. 10, 2018 by Japanese Patent Office website, 17 pages. (Year: 2000).*

(Continued)

*Primary Examiner* — Phallaka Kik
(74) *Attorney, Agent, or Firm* — Osha Liang LLP

(57) ABSTRACT

A semiconductor design apparatus computes a consumption current in a macro cell region in the semiconductor device. A first region is defined to be a first shape and size on an upper surface on at least one end of a one-side end portion of the macro cell region based on the consumption current in the macro cell region and an allowable current per via that connects a power supply layer and the macro cell region to each other. A second region is defined as a second shape and size on the upper surface of the macro cell region based on the first region. The apparatus determines an arrangement of the macro cell region and the power supply layer based on the second region and determines the arrangement of vias in the second region based on the arrangement of the macro cell region and the power supply layer.

3 Claims, 10 Drawing Sheets

(51) Int. Cl.
*H01L 23/48* (2006.01)
*H01L 23/528* (2006.01)
*H01L 23/50* (2006.01)

(52) U.S. Cl.
CPC ........ *H01L 23/481* (2013.01); *H01L 23/5286* (2013.01); *H01L 23/50* (2013.01); *H01L 2924/0002* (2013.01)

(58) Field of Classification Search
USPC .... 716/120, 122, 127, 133; 326/41, 47, 101; 257/207, 798
See application file for complete search history.

(56) References Cited

U.S. PATENT DOCUMENTS

| | | |
|---|---|---|
| 5,768,146 A | 6/1998 | Jassowski |
| 5,995,732 A | 11/1999 | Murai |
| 6,282,693 B1 | 8/2001 | Naylor et al. |
| 6,465,817 B1 | 10/2002 | Furuichi |
| 7,370,294 B1 | 5/2008 | Rahman |
| 7,382,053 B2 | 6/2008 | Takahata |
| 7,458,050 B1 | 11/2008 | Arbel et al. |
| 7,475,375 B2 | 1/2009 | Nakanishi |
| 7,966,588 B1 | 6/2011 | Perry et al. |
| 8,286,111 B2 | 10/2012 | Chandra et al. |
| 8,584,066 B1 | 11/2013 | Mau et al. |
| 2002/0170020 A1 | 11/2002 | Darden et al. |
| 2004/0102034 A1* | 5/2004 | Ito .................. G06F 17/5068 438/637 |
| 2004/0153981 A1 | 8/2004 | Wilcox et al. |
| 2004/0230921 A1 | 11/2004 | Hathaway et al. |
| 2005/0050502 A1 | 3/2005 | Kurihara et al. |
| 2005/0246676 A1 | 11/2005 | Sadakane et al. |
| 2006/0242613 A1 | 10/2006 | Fukazawa |
| 2007/0033562 A1 | 2/2007 | Correale et al. |
| 2007/0044047 A1 | 2/2007 | Kurihara et al. |
| 2007/0220471 A1 | 9/2007 | Anazawa |
| 2008/0079468 A1 | 4/2008 | Suginaka |
| 2008/0258816 A1 | 10/2008 | Hsu et al. |
| 2008/0270961 A1 | 10/2008 | Mead |
| 2009/0173972 A1* | 7/2009 | Kishishita ........... H01L 27/0207 257/207 |
| 2011/0078645 A1 | 3/2011 | Nakaya |
| 2011/0260333 A1* | 10/2011 | Matsumura ......... H01L 23/5286 257/774 |
| 2012/0081861 A1* | 4/2012 | Shimada ............. H05K 1/0228 361/737 |
| 2012/0120358 A1* | 5/2012 | Kim .................. G02F 1/136286 349/139 |
| 2014/0146630 A1 | 5/2014 | Xie et al. |
| 2015/0199460 A1 | 7/2015 | Sundaresan et al. |
| 2015/0372008 A1* | 12/2015 | Danardono ....... H01L 27/11898 257/48 |

FOREIGN PATENT DOCUMENTS

| | | | |
|---|---|---|---|
| JP | 2001-160613 A | | 6/2001 |
| JP | 2001308272 A | * | 11/2001 |
| JP | 2007-258215 A | | 10/2007 |
| JP | 2010-123895 A | | 6/2010 |

OTHER PUBLICATIONS

Takamitsu et al., Machine English Translation of Japanese Patent Document No. JP-2013-208008, Published Nov. 21, 2008, Machine Translated on Nov. 10, 2018 by Japanese Patent Office website, 18 pages. (Year: 2008).*
Tetsuya, Machine English Translation of Japanese Patent Document No. JP-2007-258215, Published Oct. 4, 2007, Machine Translated on Nov. 10, 2018 by Japanese Patent Office website, 18 pages. (Year: 2007).*
Toru et al., Machine English Translation of Japanese Patent Document No. JP-63-152144, Published Jun. 24, 1988, Machine Translated on Nov. 10, 2018 by Japanese Patent Office website, 6 pages. (Year: 1988).*
Takahiro, Machine English Translation of Japanese Patent Document No. JP-2010-123895, Published Jun. 3, 2010, Machine Translated on Nov. 10, 2018 by Japanese Patent Office website, 12 pages. (Year: 2010).*
Office Action issued in corresponding Japanese Application No. 2014-069125, dated Jan. 23, 2018 (6 pages).

* cited by examiner

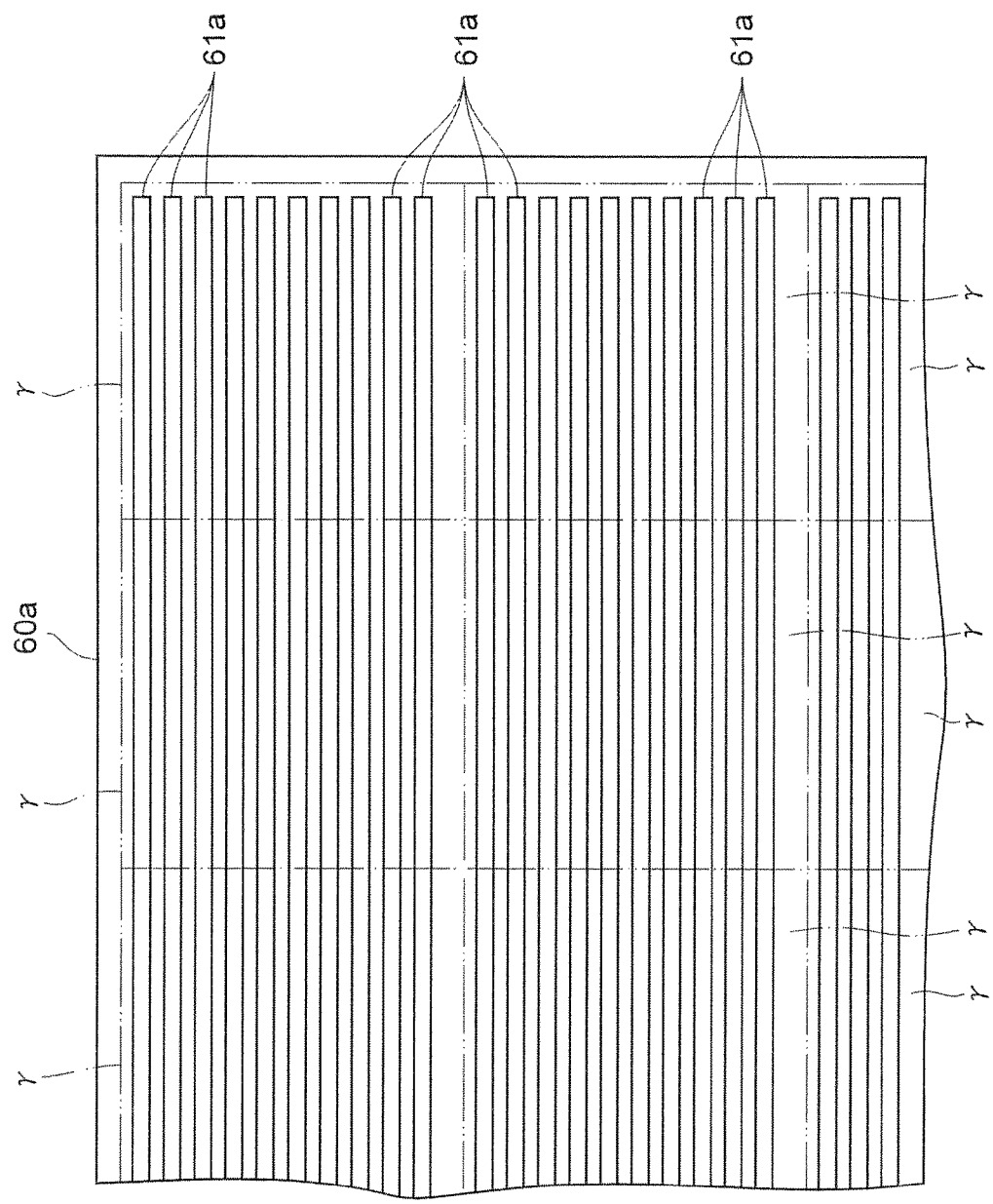

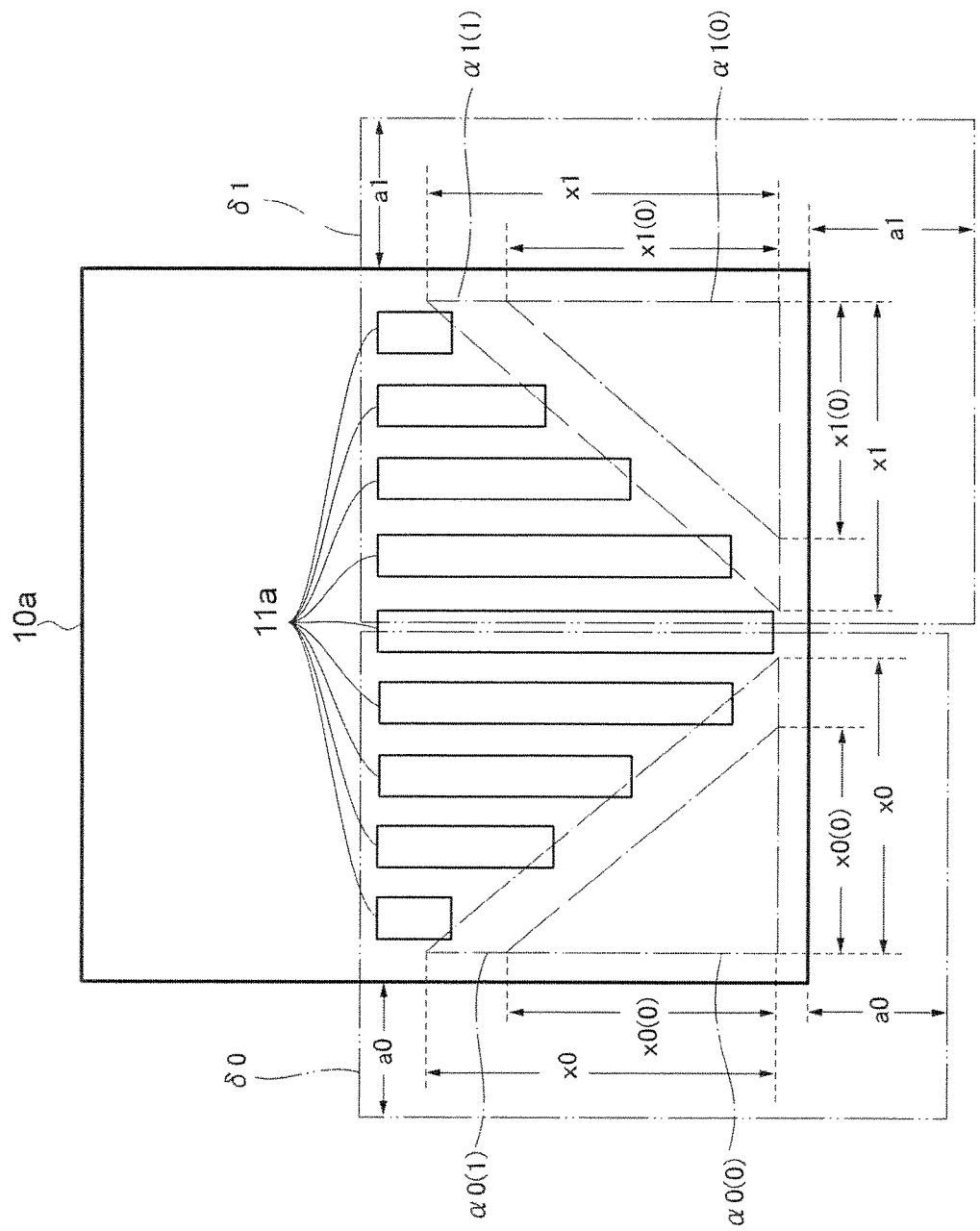

SEMICONDUCTOR DEVICE AND METHOD FOR DESIGNING A SEMICONDUCTOR DEVICE

CROSS-REFERENCE TO RELATED APPLICATIONS

This application is a divisional application of U.S. patent application Ser. No. 14/670,972, filed on Mar. 27, 2015, now U.S. Pat. No. 9,754,066 B2, which claims priority to Japanese Patent Application No. 2014-069125, filed Mar. 28, 2014.

FIELD OF THE INVENTION

One or more embodiments of the present invention relate to a semiconductor device and a method for designing the semiconductor device.

BACKGROUND OF THE INVENTION

Conventionally, a semiconductor device in which a logic circuit is arranged in accordance with a specification of a target system is formed on a periphery of a large-scale macro cell (i.e., a CPU and a memory cell), which is formed as a core of the semiconductor device on a single substrate. In such a semiconductor device, in general, power supply wiring lines for the entire semiconductor device are arranged such that metal wiring lines in upper layers are formed in a matrix. Further, a power supply wiring layer for the macro cell is provided as power supply straps above the macro cell. The power supply wiring layer for the macro cell is connected to the power supply wiring lines for the entire semiconductor device through vias, and thus electric power is supplied to the macro cell.

The vias are typically arranged to fill the layers of the entire power supply wiring lines for the macro cell region. Other wiring lines, such as signal lines, in the semiconductor device, therefore, cannot pass through the region where the macro cell is disposed. For example, in a case where the macro cell is provided between nodes to be connected to each other with a signal wiring line, the signal wiring line needs to extend from one of the nodes toward the other node along a path around the macro cell. As a result, congestion of signal wiring lines that need to detour occurs in a portion around the macro cell in the semiconductor device. The congestion of signal wiring lines around the macro cell adversely affects the semiconductor device in such a way that the congestion prevents reduction in the area of the semiconductor device and reduction in the number of wiring layers. As a result, the area of the semiconductor device and the number of layers therein cannot be reduced.

For example, in a case where the macro cell is a memory cell, the degree of the congestion of signal wiring lines around the macro cell further increases. That is, the memory cell typically comprises a memory cell array and a controller, which controls input/output operation between the memory cell and an external device, and thus the controller is typically disposed in the memory cell and adjacent to the external device. Further, since the controller consumes the most power in the memory cell, power supply wiring layers for the memory cell are disposed above the controller to achieve maximum efficiency. The power supply wiring layers for the memory cell are, therefore, typically disposed in the memory cell and adjacent to the external device so that the power supply wiring layers undesirably tend to physically interfere with signal wiring lines in the vicinity of the memory cell. Therefore, the degree of congestion of the signal wiring lines around the memory cell further increases.

Japanese Patent Publication No. 2001-160613 (hereinafter the "'613 publication") discloses a semiconductor device that includes a macro cell region and a logic region formed around the macro cell region and in which the macro cell region has a logic wiring region for providing wiring lines in the logic region. More specifically, the semiconductor device disclosed in the '613 publication, which is configured so that the macro cell region includes the wiring region in the logic region, allows the wiring lines in the logic region to be provided in the macro cell region, whereby the semiconductor device reduces the necessity of routing the wiring lines in the logic region around the macro cell region. Consequently, the semiconductor device disclosed in the '613 publication achieves reduction in the capacitance of the wiring lines in the logic region and prevention of congestion of the wiring lines around the macro cell region, and thereby the semiconductor device achieves high speed operation of a circuit and a high density of integration of the circuit.

Japanese Patent Publication No. 2010-123895 (hereinafter the "'895 publication") discloses a semiconductor device and a design method that allow the use of cells in which vias are disposed in the vicinity of power supply wiring lines. More specifically, the semiconductor device disclosed in the '895 publication in which power supply straps in an upper-level metal wiring layer are disposed at fixed intervals on a chip surface that comprises cell power supply wiring lines in a low-level wiring layer disposed in the direction perpendicular to the power supply straps and an intermediate metal wiring layer connected to the power supply straps and disposed in parallel to the cell power supply wiring lines, wherein a plurality of power supply vias that connect the intermediate metal wiring layer and the cell power supply wiring lines to each other are grouped and disposed in high-density regions, low-density regions, and no-via regions in which area-saving cells are disposed. The area-saving cells are cells in which cell areas are reduced by disposing in-cell vias in the vicinity of the power supply wiring lines. Thus, the semiconductor device and layout method disclosed in the '895 publication allow the use of cells in which vias are disposed in the vicinity of the power supply wiring lines, thereby achieving area saving of cells.

In the semiconductor device disclosed in the '613 publication described above, the congestion of the signal wiring lines around the macro cell region can be reduced in a manner that the macro cell region has the logic wiring region for providing signal wiring lines in the logic region. However, the '613 publication does not disclose how to provide the logic wiring region in the macro cell region. The semiconductor device disclosed in the '613 publication decreases the current and power supply voltage supplied to the macro cell region due to a large logic wiring region provided in the macro cell region and inefficiently utilizes the unused regions in the macro cell region due to a small logic wiring region provided in the macro cell region. Further, the '613 publication, which requires modification of the macro cell region itself, increases the number of man-hours required to design the semiconductor device due to the modification of the macro cell region.

In the method for designing a semiconductor device disclosed in the '895 publication described above, by way of adjusting the density of the vias along the power supply wiring lines and arranging regions where no vias are disposed along the power supply wiring lines, regions which allow use of cells in which vias are disposed in the vicinity of the power supply wiring lines are formed to save space in the cells. However, the design method cannot reduce the congestion of signal wiring lines around the macro cell region. Further, the '895 publication, which requires modification of the cells, also increases the number of man-hours required to design the semiconductor device due to the modification of the cells, as in the '613 publication.

One or more embodiments of the present invention provide a semiconductor device design method that efficiently solves congestion of signal wiring lines and, thus, allows reduction in the chip area of and reduction in the number of wiring layers in the semiconductor device.

More specifically, one or more embodiments of the present invention provide a semiconductor device design method that solves congestion of signal wiring lines that occurs around a macro cell region by efficiently arranging vias in the macro cell and, thus, allows reduction in the chip area of and reduction in the number of wiring layers in the semiconductor device.

SUMMARY OF THE INVENTION

One or more embodiments of the present invention provide a semiconductor device design method. The method may comprise: computing a consumption current in a macro cell region in a semiconductor device based on a virtual-model-based simulation of an operation of the semiconductor device; defining a first region as having a first shape and size on an upper surface on at least one end of a one-side end portion of the macro cell region based on the consumption current in the macro cell region and an allowable current per via that connects a power supply layer and the macro cell region in the semiconductor device to each other; defining a second region as having a second shape and size on the upper surface of the macro cell region based on the first region; determining an arrangement of the macro cell region and the power supply layer in the semiconductor device based on the second region; and determining an arrangement of vias in the second region based on the arrangement of the macro cell region and the power supply layer.

The defining the first region may comprise defining a region on the upper surface on or above both ends of the one-side end portion.

The design method may further comprise: evaluating a predetermined electrical effect that occurs in the power supply layer; and determining based on the evaluating whether the predetermined electrical effect falls within a first acceptable range. If a result of the determining shows that the predetermined electrical effect does not fall within the first acceptable range, the first region may be newly determined and the arrangement of the macro cell region and the power supply layer may then be determined.

Further, the evaluating the predetermined electrical effect may comprise evaluating a degree of voltage drop that occurs in the power supply layer.

The evaluating the predetermined electrical effect may comprise evaluating a degree of an electro-migration effect that occurs in the semiconductor device.

The design method may further comprise determining an arrangement of a logic region and a wiring layer based on the arrangement of the macro cell region and the power supply layer.

Further, the determining the arrangement of the wiring layer may comprise providing the wiring layer in at least one of a position between the logic region and the power supply layer and a position between the first region and the power supply layer.

The design method may further comprise computing a degree of congestion in the wiring layer based on the arrangement of the wiring layer and determining whether the degree of congestion falls within a second acceptable range. If a result of the determination shows that the degree of congestion does not fall within the second acceptable range, the first region may be newly determined and the arrangement of the wiring layer may then be determined.

Further, the computing the degree of congestion may comprise defining a third region as a region above the first region and a region above a portion around the at least one end of the one-side end portion of the macro cell region; and computing a ratio of a specific region in the third region where the wiring layer is arranged to the third region.

One or more embodiments of the present invention may be a semiconductor design apparatus for designing a semiconductor device. The semiconductor design apparatus may comprise: a unit that computes a consumption current in a macro cell region in the semiconductor device based on a virtual-model-based simulation of an operation of the semiconductor device; a unit that defines a first region as having a first shape and size on an upper surface on at least one end of a one-side end portion of the macro cell region based on the consumption current in the macro cell region and an allowable current per via that connects a power supply layer and the macro cell region in the semiconductor device to each other; a unit that defines a second region as having a second shape and size on the upper surface of the macro cell region based on the first region; a unit that determines an arrangement of the macro cell region and the power supply layer in the semiconductor device based on the second region; and a unit that determines an arrangement of the vias in the second region based on the arrangement of the macro cell region and the power supply layer.

One or more embodiments of the present invention may be a semiconductor device comprising a macro cell region formed by at least one cell circuit; a power supply layer configured to supply electric power to the macro cell region through vias; and a wiring layer for signal communication. The macro cell region may comprise a plurality of power supply straps that extend in a direction from a one-side end portion toward an other-side end portion of the macro cell region. At least two of the plurality of power supply straps may be arranged such that front-end portions thereof form an echelon pattern on an upper surface on at least one end of the one-side end portion of the macro cell region so as to form a predetermined region for the wiring layer.

At least two of the plurality of power supply straps, which form the echelon pattern, may be arranged such that the front-end portions thereof may be recessed stepwise in a region from a central portion of the one-side end portion of the macro cell region toward a side comprising the at least one end.

The semiconductor device may further comprise a logic region arranged in a periphery of the macro cell region, and the wiring layer may be provided in at least one of a position between the logic region and the power supply layer and a position between the predetermined region and the power supply layer.

In the present disclosure, the means does not simply mean physical device, and a case where the function of the means is achieved by software may be conceivable. Further, the function of single means may be achieved by two or more physical means, and the functions of two or more means may be achieved by single physical means.

According to one or more embodiments of the present invention, a semiconductor device allows reduction in the chip area of the semiconductor device and reduction in the number of wiring layers by efficiently solving congestion of signal wiring lines.

Other technical features, purposes, and advantageous effects as well as advantages of the present invention will be apparent from the following embodiments described with reference to the attached drawings.

BRIEF DESCRIPTIONS OF THE DRAWINGS

FIG. 3B shows a wiring layer arrangement model that the semiconductor design apparatus according to one or more embodiments of the present invention uses;

FIG. 3C shows a macro cell region arrangement model that the semiconductor design apparatus according to one or more embodiments of the present invention uses;

DETAILED DESCRIPTION

One or more embodiments of the present invention will be described with reference to the drawings.

Figure 1:
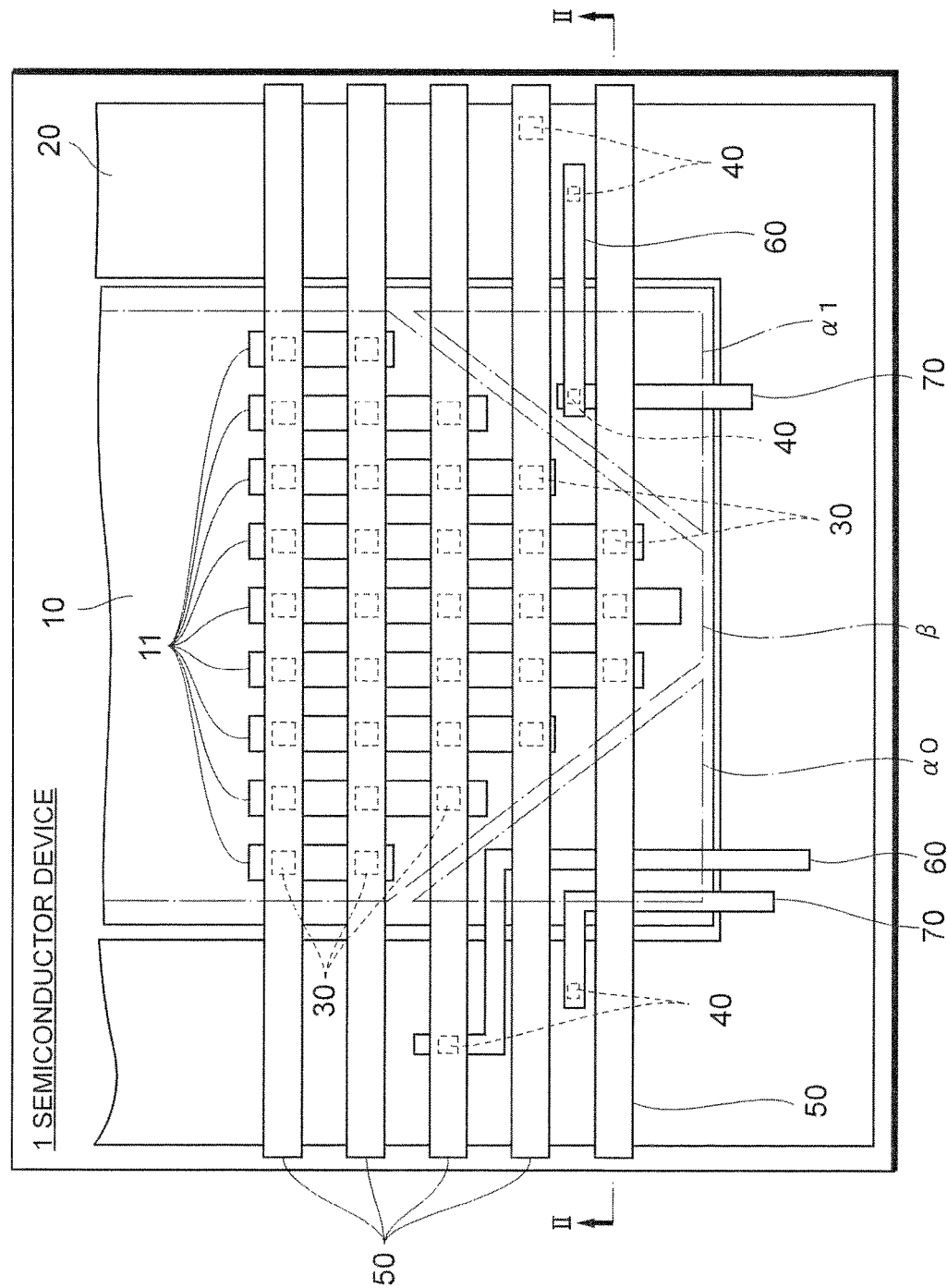
FIG. 1 shows an example of a schematic configuration of a semiconductor device produced by using a semiconductor design method according to one or more embodiments of the present invention.
Figure 2:
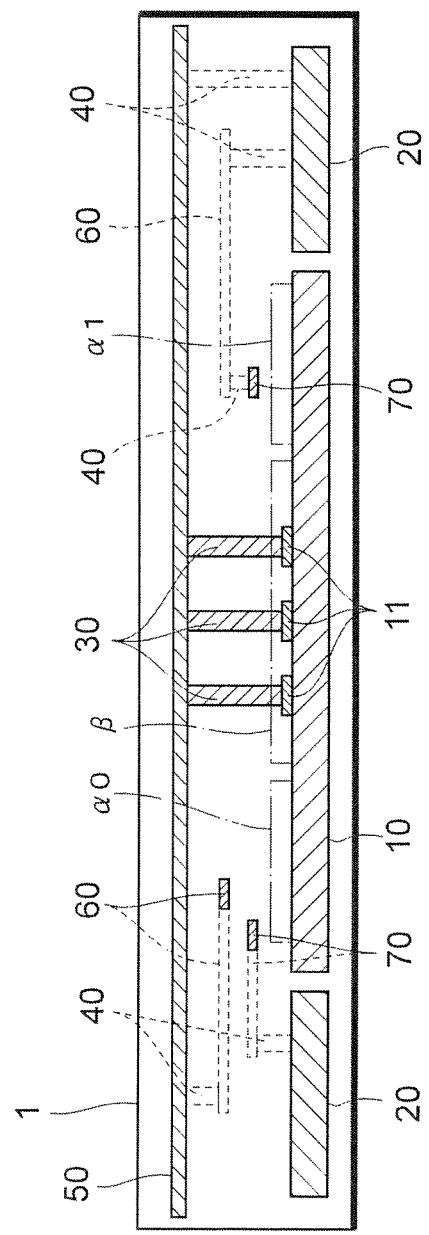
FIG. 2 shows an example of a schematic configuration of a semiconductor device produced by using a semiconductor design method according to one or more embodiments of the present invention.

FIGS. 1 and 2 show an example of a schematic configuration of a semiconductor device produced by a semiconductor design method according to one or more embodiments of the present invention. Specifically, FIG. 1 is a diagrammatic plan view of a specific portion of the semiconductor device 1. FIG. 2 is a schematic cross-sectional view of the semiconductor device 1 shown in FIG. 1 and taken along the line II-II. The semiconductor device 1 may, for example, comprise a macro cell region 10, a logic region 20, vias 30 and 40, a power supply layer 50, and wiring layers 60 and 70, as shown in FIGS. 1 and 2. In this example, the specific portion may be a portion comprising a one-side end portion and/or a one-side side portion of the macro cell region 10 and a periphery thereof in the semiconductor device 1. According to one or more embodiments of the present invention, a first direction is defined as a direction from the one-side end portion of the macro cell region 10 toward an other-side end portion that faces the one-side end portion, and that a second direction is defined as a direction perpendicular to the first direction in a plan view. The layout of the semiconductor device 1 described above may be optimized and determined by a semiconductor design method that will be described later.

The macro cell region 10 may be a cell formed by a combination of a plurality of cell circuits and be, for example, a memory cell (RAM or ROM) or a CPU. The macro cell region 10 may be provided, for example, in the lowest layer of the semiconductor device 1, as shown in FIG. 2. The macro cell region 10 may be electrically connected to the power supply layer 50, which is an upper layer, through the vias 30 formed on power supply straps 11. The macro cell region 10 may, thus, obtain current necessary for operation thereof from the power supply layer 50 through the vias 30.

Regions of the upper surface of both ends of the one-side end portion of the macro cell region 10 may be defined as regions α0 and α1, as will be described later. The vias 40 and the wiring layers 60 and 70 may be disposed above the regions α0 and α1 in accordance with a predetermined design method (see FIG. 2). In this example, each of the regions α0 and α1 may have a substantially triangular shape in a plan view. The shape and area of each of the regions α0 and α1 may be determined based on the number of vias 30, which may be connected to the macro cell region 10, as will be described later in detail. In FIGS. 1 and 2, the regions α0 and α1 may be provided on the upper surface on both ends of the one-side end portion of the macro cell region 10, but both the two regions are not necessarily provided and only one of the regions α0 and α1 may instead be provided. Further, in FIGS. 1 and 2, the regions α0 and α1 are drawn in substantially the same area and shape but are not necessarily configured so and may instead have different areas and shapes.

According to one or more embodiments of the present invention, a region β may be provided on the upper surface of the macro cell region 10 and in a region where the regions α0 and α1 are not present. A plurality of power supply straps 11, which extend, for example, in the first direction, may be formed in the region β. Specifically, some of the plurality of power supply straps 11 may be arranged in the region β so that front-end portions thereof form an echelon pattern on the upper surface on at least one end of the one-side end portion of the macro cell region 10. For example, the front-end portions of the power supply straps 11 may be recessed stepwise along the boundaries between the region β and the regions α0, α1, and the amount of the recess may increase as the distance to the outer circumference of the macro cell region 10 decreases. In other words, the plurality of power supply straps 11 on the macro cell region 10 may be arranged so that regions where the wiring layers 60 and 70 to be disposed (regions corresponding to regions α0 and α1) are provided.

The logic region 20 may, for example, be a logic circuit, such as a PLL circuit, an AD converter, an operational amplifier, and a standard cell. The logic region 20 may be provided, for example, in the lowest layer of the semiconductor device 1 and around the macro cell region 10. The vias 40 may electrically connect the logic region 20 to the power supply layer 50 and the wiring layers 60 and 70, which may be disposed above the vias 40.

The vias 30 and 40 may be interlayer connection regions that electrically connect components in layers in the semiconductor device 1 to each other. According to one or more embodiments of the present invention, the vias 30 may electrically connect the macro cell region 10 and the power supply layer 50 to each other, and the vias 40 may electrically connect the components other than those in the macro cell region 10 to each other. The vias 40 may be provided, for example, between the logic region 20 and the power supply layer 50. In another example, the vias 40 may be provided between the logic region 20 and at least one of the wiring layers 60 and 70. In still another example, the vias 40 may be provided between at least one of the wiring layers 60 and 70 and the power supply layer 50. In still another example, the vias 40 may be provided between the wiring layers 60 and 70. Since the amount of current Ic that one of the vias 30 can supply (i.e., allowable current) may be limited, the number of vias 30 necessary to supply the amount of current that the macro cell region 10 requires (i.e., consumption current Im) may be connected to the macro cell region 10. The vias 30 and 40, if they connect components in a large number of layers to each other, may include the wiring layers 60 and 70 as the interlayer connection regions.

The power supply layer 50 may be typically formed by a plurality of power supply wiring lines that extend in the second direction and provided, for example, in the highest layer of the semiconductor device 1. That is, in this example, the power supply layer 50 may be provided perpendicular to the power supply straps 11. The power supply layer 50 may be a layer that supplies current to the components in the semiconductor device 1. As FIGS. 1 and 2 simulatively show the connection of the power supply layer 50, each of the power supply straps 11 may be connected to the relevant power supply layer 50 depending on the type of power supply.

The wiring layers 60 and 70 may be layers that electrically connect the components in the layers in the semiconductor device 1 to each other for communication of predetermined signals in the semiconductor device 1. A wiring layer 60 may be provided, for example, between at least one of the logic regions 20 and the wiring layers 70 and the power supply layer 50. A wiring layer 70 may be provided between at least one of the power supply layer 50 and the wiring layers 60 and the logic region 20. Further, wiring layers 60 and 70 may be provided between at least one of the regions $\alpha 0$ and $\alpha 1$ and the power supply layer 50. Some of the wiring layers 60 and 70 may be electrically connected to each other, for example, through vias 40, and others may be electrically connected to the logic region 20 and the power supply layer 50 through vias 40, as described above.

In the semiconductor device 1 according to one or more embodiments of the present invention, in which the wiring layers 60 and 70 may be provided, the two wiring layers are not necessarily provided and a different number of wiring layers may be provided.

Figure 7:
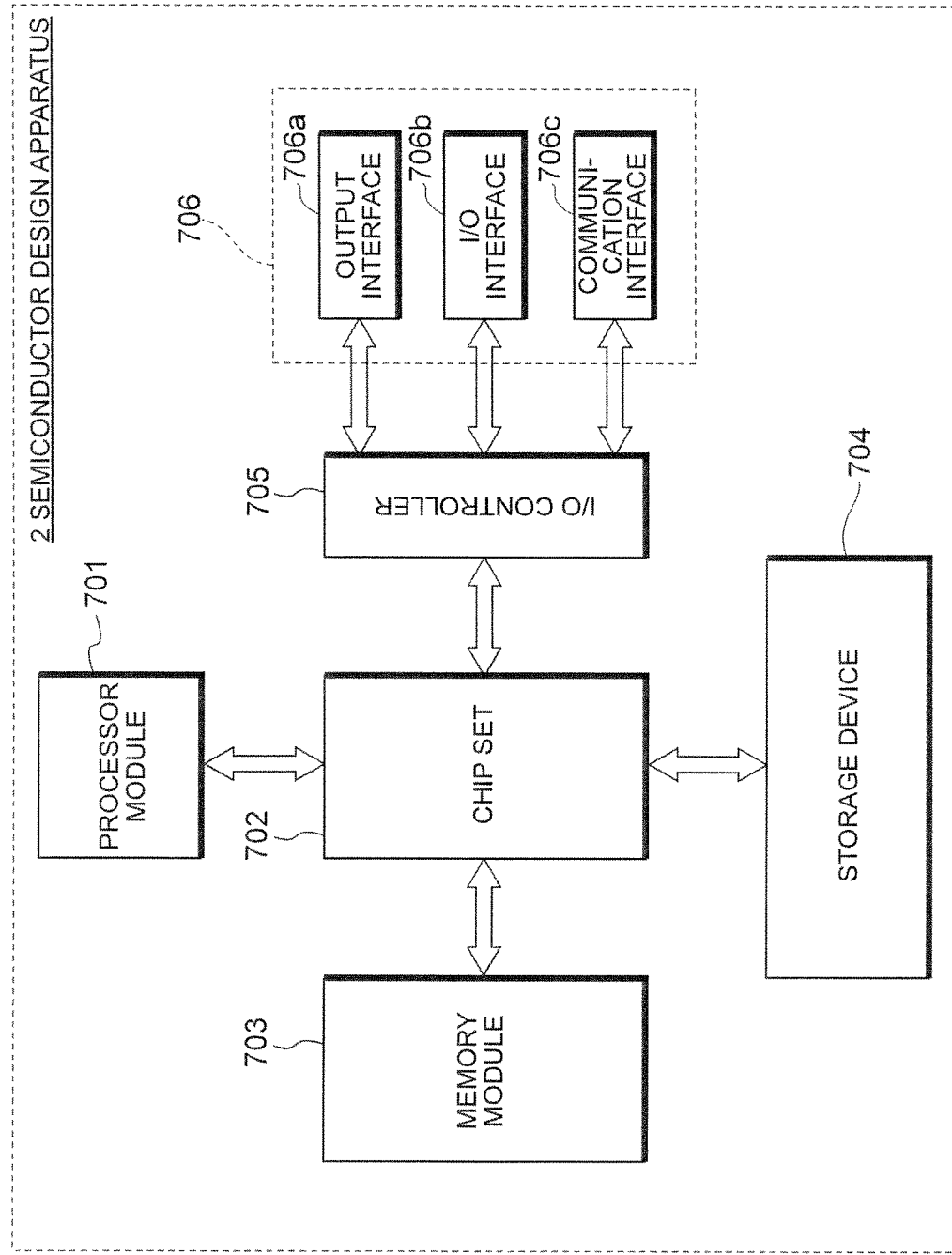
FIG. 7 is a block diagram showing an example of a schematic hardware configuration of the semiconductor design apparatus according to one or more embodiments of the present invention.

The layout of the semiconductor device 1 described above may be designed by a semiconductor design apparatus 2. The semiconductor design apparatus 2 may, for example, be a general-purpose computer, a control apparatus, or a simulator. The semiconductor design apparatus 2 may determine an arrangement of the macro cell region 10, the logic region 20, the power supply straps 11, the vias 30 and 40, the power supply layer 50, and the wiring layers 60 and 70 in the semiconductor device 1, for example, by executing a predetermined design program. In designing the semiconductor device 1, the semiconductor design apparatus 2 may use a virtual model, which is called an arrangement model, simulatively showing an arrangement, electrical characteristics, and other factors of the components of the semiconductor device 1 to evaluate the arrangement and a variety of electrical characteristics of the components. An example of a schematic configuration of the semiconductor design apparatus 2 is shown in FIG. 7.

In a method for designing the semiconductor device 1 according to one or more embodiments of the present invention, the semiconductor design apparatus 2 may determine the number of vias 30 first, which may be connected to the macro cell region 10, based on the consumption current Im in the macro cell region 10. The semiconductor design apparatus 2 may then determine the area and shape of each of the regions $\alpha 0$ and $\alpha 1$ in the macro cell region 10 based on the determined number of vias 30 and determines the area, shape, and arrangement of the region $\beta$, where the power supply straps 11 may be disposed in the macro cell region 10, based on the area and shape of each of the regions $\alpha 0$ and $\alpha 1$. The semiconductor design apparatus 2 may then arrange the components in the semiconductor device 1 based on the area, shape, and the arrangement of the region $\beta$. The semiconductor design apparatus 2 may further compute a degree of congestion in the wiring layers 60 and 70 and determine whether or not the degree of congestion satisfies a certain reference. If a result of the determination shows that the degree of congestion does not satisfy the certain reference, the semiconductor design apparatus 2 may determine the regions $\alpha 0$ and $\alpha 1$ again based on the degree of congestion. On the other hand, if a result of the determination shows that the degree of congestion satisfies the certain reference, the semiconductor design apparatus 2 may complete the design. Because the vias 40 and the wiring layers 60 and 70 may be disposed above the regions $\alpha 0$ and $\alpha 1$ as described above, the semiconductor device 1 according to one or more embodiments of the present invention will not be congested in the wiring layers 60 and 70 that occur in the vicinity of the macro cell region 10 and achieve reduction in the area of the semiconductor device 1 and the number of wiring layers therein.

Figure 3A:
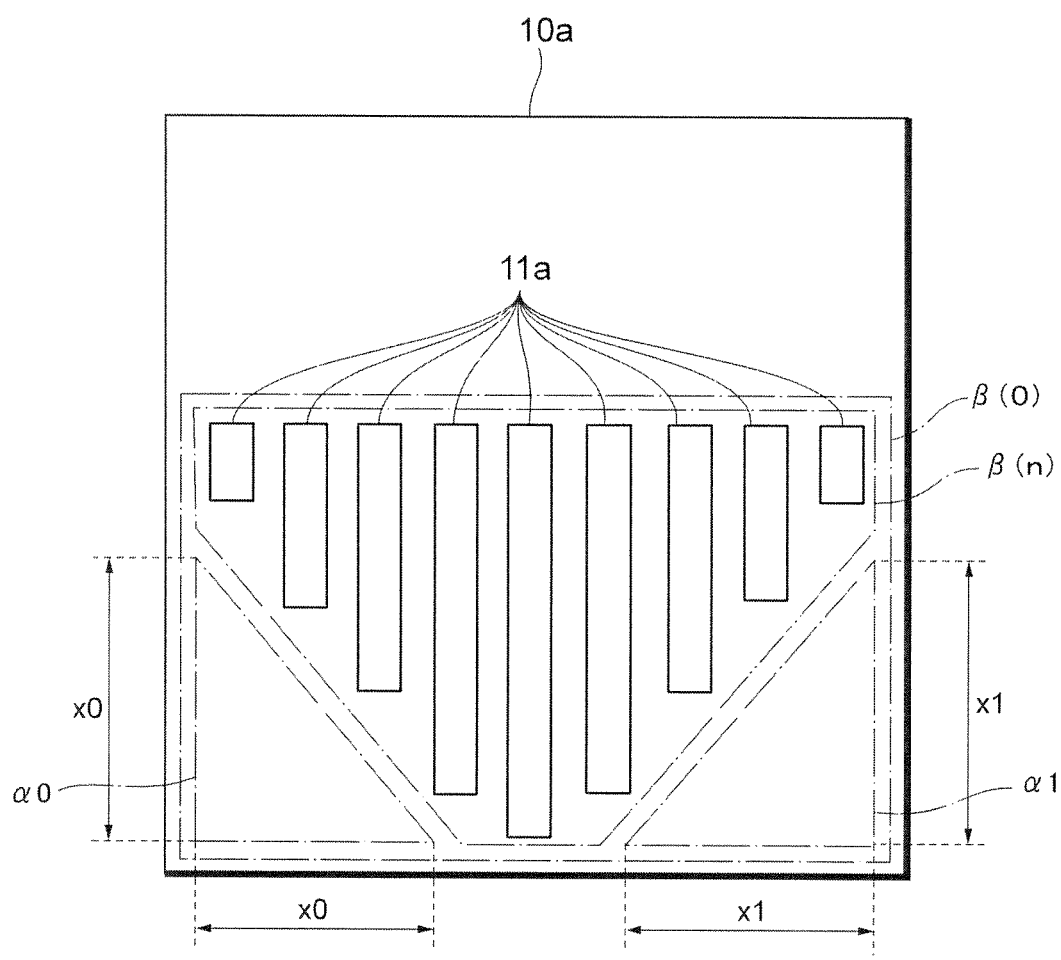
FIG. 3A shows a macro cell region arrangement model that a semiconductor design apparatus according to one or more embodiments of the present invention uses.

An example of the method for designing the semiconductor device 1 according to one or more embodiments of the present invention will be described with reference to FIGS. 3A to 6. FIG. 3A shows a macro cell region arrangement model that the semiconductor design apparatus according to one or more embodiments of the present invention uses. A macro cell region arrangement model 10*a* may include a power supply strap arrangement model 11*a*, the region $\beta$, and the regions $\alpha 0$ and $\alpha 1$, as shown in FIG. 3A. The macro cell region arrangement model 10*a* may be a virtual model simulatively showing an arrangement, electrical characteristics, and other factors of the components in the macro cell region 10.

The power supply strap arrangement model 11*a* may be a virtual model simulatively showing an arrangement, electrical characteristics, and other factors of the power supply straps 11 in the macro cell region 10. The power supply strap arrangement model 11*a* may be provided in the region $\beta$ in the macro cell region arrangement model 10*a*.

The region $\beta$ may be a region where the power supply straps 11 can be disposed in the macro cell region 10. The area, shape, and arrangement of the region $\beta$ may vary in the design process of the semiconductor device 1. A region $\beta(0)$ may be a first generation of the region $\beta$ in the design process of the semiconductor device 1; in other words, the region $\beta$ in a case where each area of the regions $\alpha 0$ and $\alpha 1$ is zero. A region $\beta(n)$ may be a final generation of the region $\beta$ in the design process of the semiconductor device 1.

In the method for designing the semiconductor device 1 according to one or more embodiments of the present invention, the lengths of the non-oblique sides of the regions $\alpha 0$ and $\alpha 1$ may be defined to be x0 and x1, respectively. In FIG. 3A, the areas and shapes of the regions $\alpha 0$ and $\alpha 1$ are shown to be substantially equal to each other but are not necessarily so and may differ from each other. Further, in the method for designing the semiconductor device 1 according to one or more embodiments of the present invention, the lengths of the non-oblique sides of the region α0 may be assumed to be equal to each other but are not necessarily so and may differ from each other to the extent that the area of the region α0 is maintained. The same may apply to the region α1, and the lengths of the non-oblique sides of the region α1 may differ from each other to the extent that the area of the region α1 is maintained, as in the region α1.

FIG. 3B shows a wiring layer arrangement model that the semiconductor design apparatus according to one or more embodiments of the present invention uses. Specifically, FIG. 3B shows a wiring layer arrangement model 60a for diagrammatically showing the state of the wiring layers 60 and 70 corresponding to a region δ in FIG. 3C, which will be described later. The wiring layer arrangement model 60a may be referred to in the computing of the degree of congestion of wiring lines that will be described later. As shown in FIG. 3B, the wiring layer arrangement model 60a may be a virtual model simulatively showing an arrangement, electrical characteristics, and other factors of the wiring lines in the wiring layers 60 and 70 and may be defined by the semiconductor design apparatus 2 in accordance with the number of wiring layers. The wiring layer arrangement model 60a may, for example, comprise wiring tracks 61a. In FIG. 3B, unit regions γ each having a predetermined shape and area may be defined as regions provided in the wiring layer arrangement model 60a so that the wiring layer arrangement model 60a is covered with the unit regions γ.

Each of the wiring tracks 61a may be a stripe-shaped region in which a wiring line can be disposed in the wiring layer arrangement model 60a. The wiring tracks 61a may be typically provided in the wiring layer arrangement model 60a in parallel to each other in the first or second direction. In FIG. 3B, the wiring tracks 61a are provided in the second direction but are not necessarily configured so.

Each of the unit regions γ may be a region that serves as a basic unit used to calculate the degree of congestion in the calculation of the degree of congestion in the wiring layers 60 and 70, and the unit regions γ may each have a predetermined shape and area and may be provided in the wiring layer arrangement model 60a so that the wiring layer arrangement model 60a is covered with the unit regions γ as described above. The calculation of the degree of congestion in the wiring layers 60 and 70 will be described later in detail.

FIG. 3C shows another macro cell region arrangement model that the semiconductor design apparatus according to one or more embodiments of the present invention uses. Specifically, FIG. 3C shows the macro cell region arrangement model 10a that the semiconductor design apparatus 2 uses and that illustrates how to change the regions α0 and α1 through description of computing the lengths x0 and x1 of the non-oblique sides of the regions α0 and α1 based on the degree of congestion in the wiring layers 60 and 70 as discussed with reference to FIGS. 4 and 5B. In this example, one end where the region α1 is present will be described, and the same may apply to the other end where the region α0 is present.

In FIG. 3C, a region δ1 may be defined as a region formed by extending sides of one of the regions on both ends of the one-side end portion of the macro cell region arrangement model 10a outward from the macro cell region arrangement model 10a by a length α1. The region δ1 may be a region used to compute a degree of congestion in the wiring layers 60 and 70 in the vicinity of the macro cell region 10. Further, in FIG. 3C, a region α1(0) and a length x1(0) may be the region α1 and the length x1 of the non-oblique side of the region before the degree of congestion in the wiring layers 60 and 70 is computed.

The semiconductor design apparatus 2 may compute the degree of congestion in the wiring layers 60 and 70 corresponding to the region δ1. The semiconductor design apparatus 2 may determine whether or not the degree of congestion satisfies a certain reference and determine the length x1 of the non-oblique side of a region α1(1) based on a result of the determination. The determination will be described later in detail.

Figure 4:
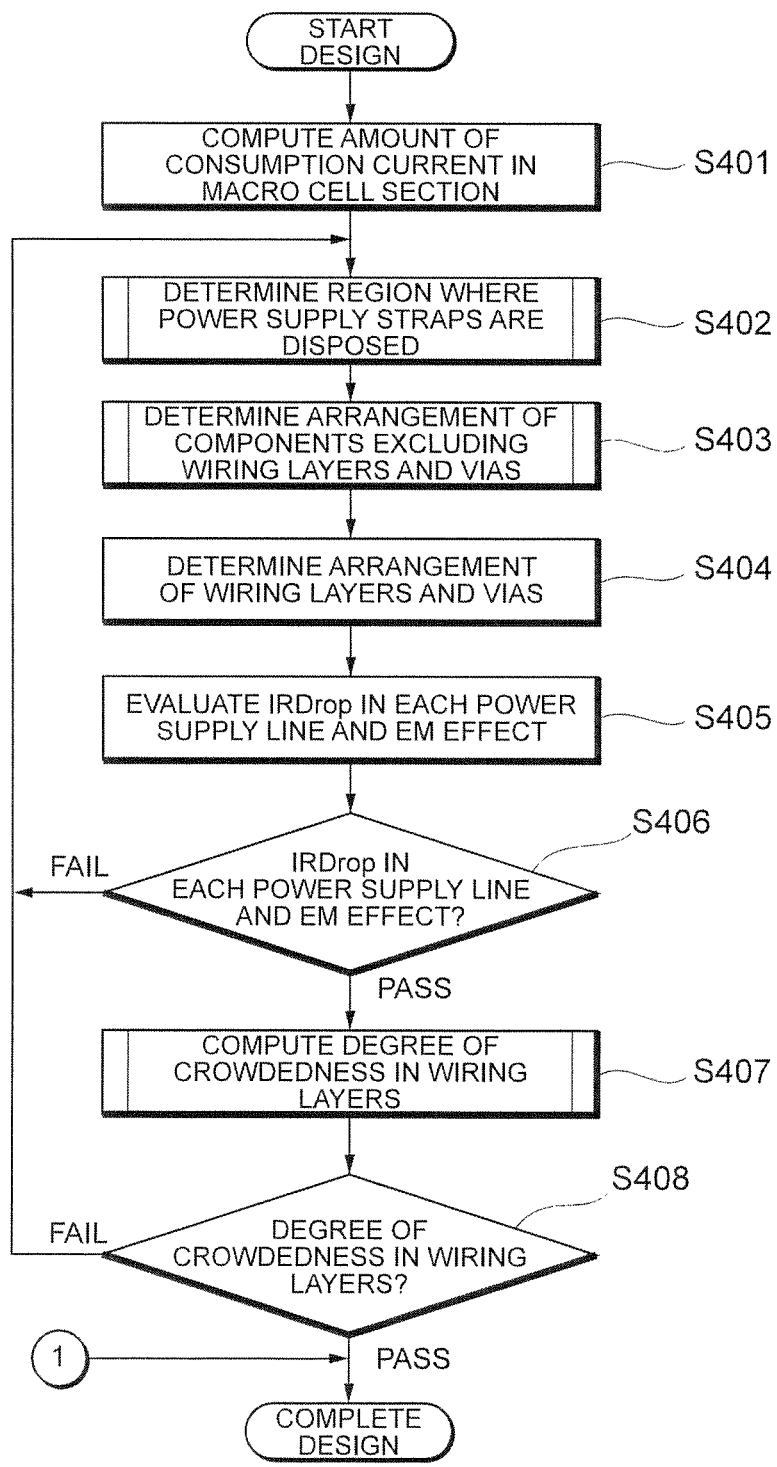
FIG. 4 is a flowchart for schematically describing a method for designing a semiconductor device according to one or more embodiments of the present invention.

FIG. 4 is a flowchart for schematically describing the method for designing a semiconductor device according to one or more embodiments of the present invention. The design method may be achieved, for example, by causing the semiconductor design apparatus 2 to execute a predetermined design program.

The semiconductor design apparatus 2 may compute the consumption current Im in the macro cell region 10 in a simulation (S401). In the simulation, actual operation of the macro cell region 10 may be estimated, for example, by causing the semiconductor design apparatus 2 to perform the same control as in the actual operation on a virtual model of the macro cell region 10 showing electric characteristics (e.g., macro cell region arrangement model 10a) and referring to the states of virtual signal lines and virtual power supply lines in the virtual model. The semiconductor design apparatus 2 may subsequently determine the area, shape, and arrangement of the region β, in which the power supply straps 11 are disposed in the macro cell region 10, based on the calculated consumption current Im in the macro cell region 10 and the acceptable current Ic per via 30 (S402). The process of the determination will be described in detail with reference to FIG. 5A.

The semiconductor design apparatus 2 may then determine the arrangement of components excluding the wiring layers 60 and 70 and the vias 30 and 40 (e.g., macro cell region 10, logic region 20, and power supply layer 50) in the semiconductor device 1 (S403). The process of the determination will be described in detail with reference to FIG. 6.

The semiconductor design apparatus 2 may determine an arrangement of the wiring layers 60 and 70 and the vias 30 and 40 in the semiconductor device 1 based on the arrangement of the components excluding the wiring layers 60 and 70 and the vias 30 and 40 in the semiconductor device 1 that is determined in the process in step S403 (S404).

The semiconductor design apparatus 2 may evaluate whether or not the semiconductor device 1 satisfies predetermined design rules. The predetermined design rules may include, for example, a degree of voltage drop (IRDrop) at each node of the power supply line in the semiconductor device 1 falling within an acceptable range specified by the semiconductor design apparatus 2 and an degree of an electro-migration effect (EM effect) in the semiconductor device 1 also falling within an acceptable range specified by the semiconductor design apparatus 2. Namely, the semiconductor design apparatus 2 may check the degrees of the voltage drop and the electro-migration effect at each node of the power supply line in the semiconductor device 1 and evaluate whether or not the degrees fall within acceptable ranges from the viewpoint of the design rules (S405). The semiconductor design apparatus 2 may determine whether the degrees of IRDrop and the EM effect are acceptable based on the evaluation (S406). If a result of the determination shows that the degrees of IRDrop and the EM effect are not acceptable (FAIL in S406), the semiconductor design apparatus 2 may proceed to the process in step S402. On the other hand, if the semiconductor design apparatus 2 determines that the degrees of IRDrop and the EM effect are acceptable based on the evaluation (PASS in S406), the semiconductor design apparatus 2 may compute a degree of congestion in the wiring layers 60 and 70 based on the determined arrangement of the wiring layers 60 and 70 and vias 30 and 40 (S407). The process of the computing will be described in detail with reference to FIG. 5B.

The semiconductor design apparatus 2 may then determine whether or not the computed degree of congestion in the wiring layers 60 and 70 is lower than or equal to an acceptable degree of congestion that is acceptable from the viewpoint of the design rules (S408). If a result of the determination shows that the degree of congestion is not lower than or equal to the acceptable degree of congestion (FAIL in S408), the semiconductor design apparatus 2 may proceed to the process in step S402. On the other hand, if the result of the determination shows that the degree of congestion is lower than or equal to the acceptable degree of congestion (PASS in S408), the semiconductor design apparatus 2 may determine that the semiconductor device 1 has been normally designed and complete the design.

Figure 5A:
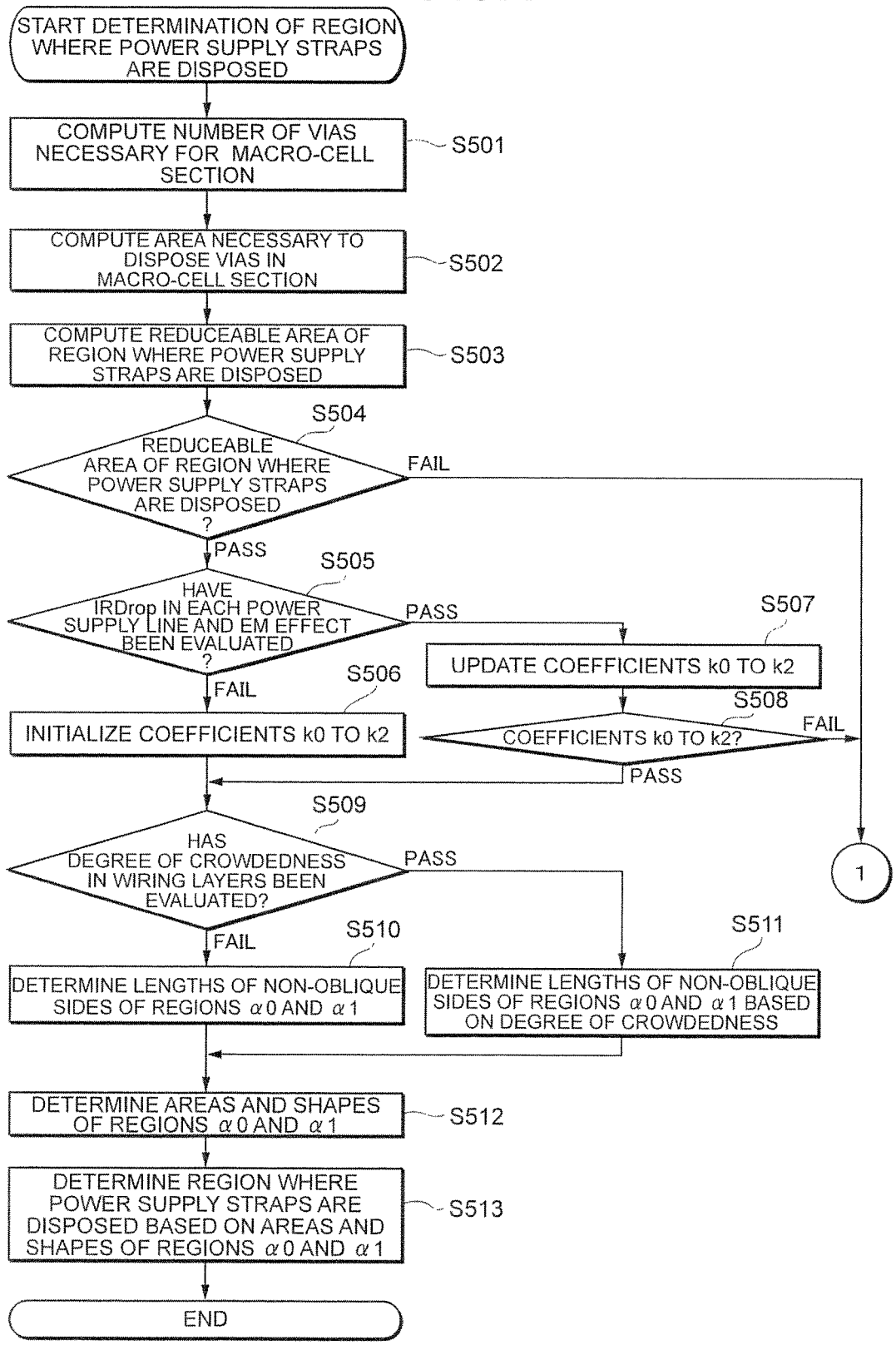
FIG. 5A is a flowchart for schematically describing the method for designing a semiconductor device according to one or more embodiments of the present invention.

FIG. 5A is a flowchart for schematically describing the method for designing a semiconductor device according to one or more embodiments of the present invention and shows the process in step S402 in FIG. 4 in detail.

The semiconductor design apparatus 2 may compute the number Nm of vias 30 necessary for the macro cell region 10 based on the consumption current Im in the macro cell region 10 computed in the process in step S401 and the acceptable current Ic per via 30 (S501). The number Nm of vias 30 necessary for the macro cell region 10 may, for example, be expressed by the following expression:

$$Nm = Im/Ic \qquad \text{<Expression 1>}$$

The semiconductor design apparatus 2 may then compute an area Sv necessary to dispose the Nm vias 30 in the macro cell region 10 (S502). The area Sv may be expressed, for example, by the following expression, assuming that Dv is a maximum density of the vias 30 that can be disposed in the semiconductor device 1 (i.e., number of vias that can be disposed in unit area):

$$Sv = Nm/Dv \qquad \text{<Expression 2>}$$

The semiconductor design apparatus 2 may further compute a reducible area Sd of the region β, where the power supply straps 11 are disposed (step S503). The area Sd may be expressed, for example, by the following expression, assuming that the area of the initial region β(0) is Sp:

$$Sd = Sp - Sv \qquad \text{<Expression 3>}$$

The semiconductor design apparatus 2 may subsequently determine whether or not the computed reducible area Sd of the region β is an acceptable value (e.g., positive value) (S504). If a result of the determination shows that the area is not an acceptable area (FAIL in S504), the semiconductor design apparatus 2 may determine that the semiconductor device 1 has not been normally designed, return back to the main procedure, and terminate the design. On the other hand, if the result of the determination shows that the area is an acceptable area (PASS in S504), the semiconductor design apparatus 2 may proceed to the process in step S505.

The semiconductor design apparatus 2 may determine whether or not the voltage drop at each node of the power supply lines and the electro-migration effect in the semiconductor device 1 (i.e., process in step S405 in FIG. 4) have been evaluated (S505). If a result of the determination shows that the voltage drop at each node of the power supply lines and the electro-migration effect in the semiconductor device 1 have not been evaluated (FAIL in S505), the semiconductor design apparatus 2 may initialize the values of coefficients k0 to k2 (S506) and proceed to the process in step S508. The coefficients k0 to k2 may be values used to determine the lengths x0 and x1 of the non-oblique sides of the regions α0 and α1, and the values may change in accordance with the evaluation of the voltage drop at each node of the power supply lines and the electro-migration effect in the semiconductor device 1. The coefficient k0 may be a value greater than or equal to 0 but less than or equal to 1, and the coefficients k1 and k2 may be values greater than or equal to 0.

On the other hand, if the result of the determination shows that the voltage drop at each node of the power supply lines and the electro-migration effect in the semiconductor device 1 have been evaluated (PASS in S505), the semiconductor design apparatus 2 may update the values of the coefficients k0 to k2 (S507). Specifically, the semiconductor design apparatus 2 may lower the values of coefficients k0 to k2 in the process in step S507. The semiconductor design apparatus 2 may determine whether or not each of the values of the coefficients k0 to k2 is an acceptable value (positive value, for example) (S508). If a result of the determination shows that each of the values of the coefficients k0 to k2 is not an acceptable value (FAIL in S508), the semiconductor design apparatus 2 may determine that the semiconductor device 1 has not been normally designed, return back to the main procedure, and terminate the design. On the other hand, if the result of the determination shows that each of the values of the coefficients k0 to k2 is an acceptable value (PASS in S508), the semiconductor design apparatus 2 may proceed to the process in S509.

The semiconductor design apparatus 2 may then determine whether or not the degree of congestion in the wiring layers 60 and 70 (i.e., process in step S407 in FIG. 4) has been evaluated (S509). If a result of the determination shows that the degree of congestion in the wiring layers 60 and 70 has not been evaluated (FAIL in S509), the semiconductor design apparatus 2 may determine the lengths x0 and x1 of the non-oblique sides of the regions α0 and α1 based on the reducible area Sd of the region β computed in the process in step S503 and proceed to the process in step S512 (S510). In the process in step S510, the lengths x0 and x1 may be expressed, for example, by the following expression:

$$X0 = x1 = (Sd \times k0)^{(1/2)} \qquad \text{<Expression 4>}$$

On the other hand, if the result of the determination shows that the degree of congestion in the wiring layers 60 and 70 has been evaluated (PASS in S509), the semiconductor design apparatus 2 may determine the lengths x0 and x1 of the non-oblique sides of the regions α0 and α1 based on the degree of congestion in the wiring layers 60 and 70 calculated in the process in step S407, the acceptable degree of congestion, areas Sa0 and Sa1 of the regions 60 and 61, the number N of wiring layers (2 in the present example because wiring layers 60 and 70 are present), and the lengths x0(0) and x1(0) computed in the previous computing and proceed to the process in step S512 (S511).

Specifically, in the process in step S511, the semiconductor design apparatus 2 may first compute an excess of congestion ratio based on the degree of congestion in the wiring layers 60 and 70 and the acceptable degree of congestion. The excess of congestion ratio may be a ratio representing how much the degree of congestion exceeds the acceptable degree of congestion. The excess of congestion ration may, for example, be expressed by the following expression:

(excess of congestion ratio)=(degree of congestion−acceptable degree of congestion) <Expression 5>

In the process in step S511, the semiconductor design apparatus 2 may compute the lengths x0 and x1 based on the excess of congestion ration computed by using Expression 5. The lengths x0 and x1 may, for example, be expressed by the following expressions:

$X0=\sqrt{((2 \times Sa0 \times (\text{excess of congestion ratio}) \times k1/N + x0(0)^2)}$ <Expression 6>

$X1=\sqrt{((2 \times Sa1 \times (\text{excess of congestion ratio}) \times k2/N + x1(0)^2)}$ <Expression 7>

The semiconductor design apparatus 2 may determine the areas and shapes of the regions α0 and α1 in the macro cell region 10 based on the determined lengths x0 and x1 (S512). The semiconductor design apparatus 2 may subsequently determine the shape, area, and arrangement of the region β, where the power supply straps 11 are disposed in the macro cell region 10, based on the areas and shapes of the regions α0 and α1 in the macro cell region 10 (S513) and return back to the main procedure.

Figure 5B:
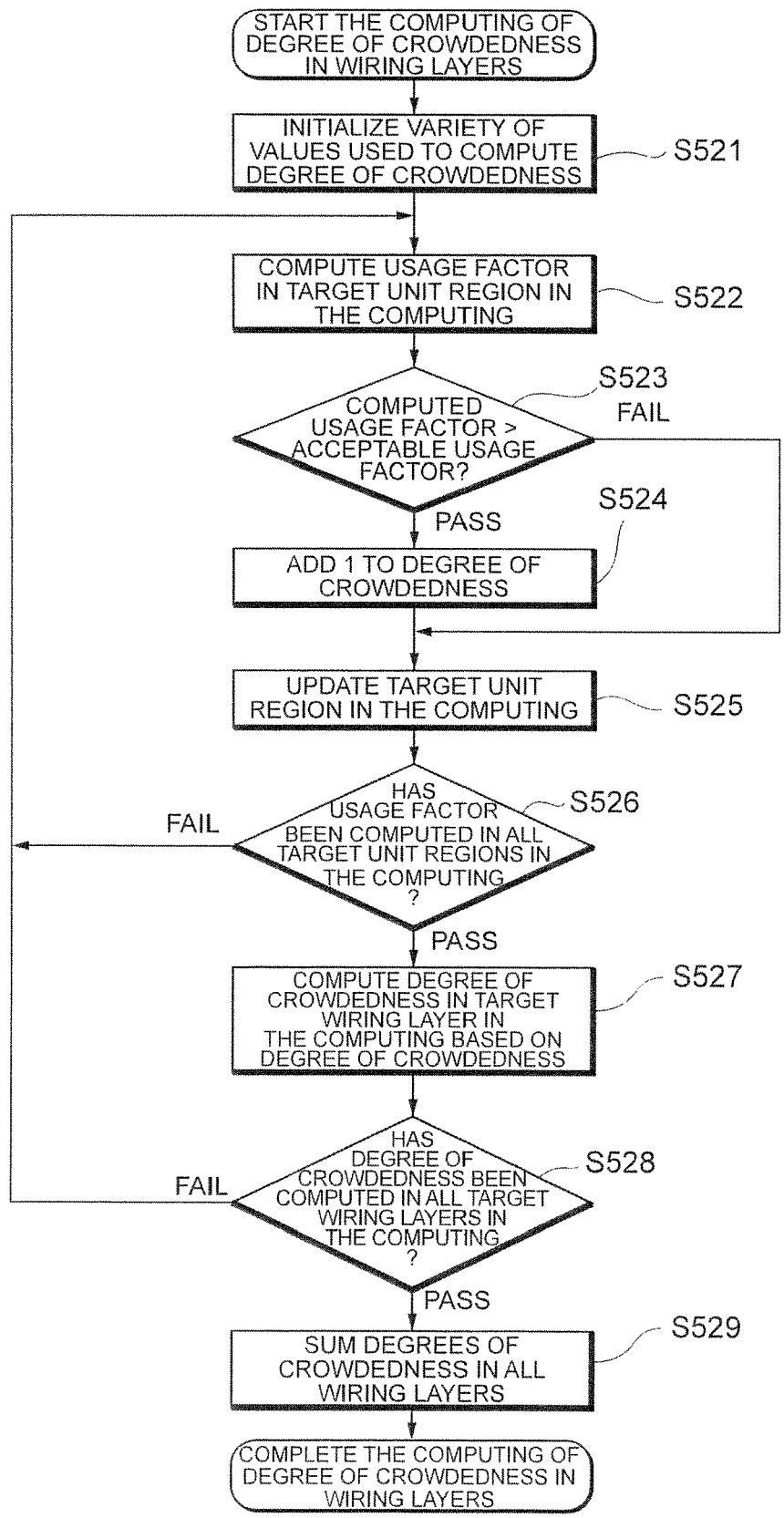
FIG. 5B is a flowchart for schematically describing the method for designing a semiconductor device according to one or more embodiments of the present invention.

FIG. 5B is a flowchart for schematically describing the method for designing a semiconductor device according to one or more embodiments of the present invention and shows the process in step S407 in FIG. 4 in detail.

The semiconductor design apparatus 2 may compute the degree of congestion in each region of the wiring layers 60 and 70 corresponding to the regions δ0 and δ1. Specifically, the semiconductor design apparatus 2 may initialize a variety of values used to compute the degree of congestion in the wiring layers 60 and 70 (e.g., utilization rate and degree of congestion) (S521). The semiconductor design apparatus 2 may then compute the utilization rate of the wiring tracks 61a in a certain wiring layer, specifically, in a unit region γ that is a target region of the wiring layers 60 and 70 in the computing (S522). The utilization rate is a ratio of the number of wiring tracks 61a where wiring lines are provided in a unit region γ to the number of wiring tracks 61a present in the unit region γ.

The semiconductor design apparatus 2 may then determine whether or not the computed utilization rate in the unit region γ is greater than an acceptable utilization rate (S523). If a result of the determination shows that the computed utilization rate of the wiring tracks 61a in the unit region γ is greater than the acceptable utilization rate (PASS in S523), the semiconductor design apparatus 2 may add 1 to the degree of congestion (S524) and update the target unit region γ in the calculation (S525). On the other hand, if the result of the determination shows that the calculated utilization rate of the wiring tracks 61a in the unit region γ is not greater than the acceptable utilization rate (FAIL in S523), the semiconductor design apparatus 2 may update the target unit region γ in the computing (S525). The acceptable utilization rate may be arbitrarily determined based on manufacturing processes, design rules, and the structure of the semiconductor device 1.

The semiconductor design apparatus 2 may determine whether or not the utilization rate has been computed in all the target unit regions γ in the computing (S526). If a result of the determination shows that the utilization rate has not been calculated in all the target unit regions γ in the computing (FAIL in S526), the semiconductor design apparatus 2 may proceed to the process in step S522. On the other hand, if the result of the determination shows that the utilization rate has been computed in all the target unit regions γ in the calculation (PASS in S526), the semiconductor design apparatus 2 may compute the degree of congestion in the target wiring layer in the computing based on the degree of congestion computed in the process in step S524 and the number of unit regions γ present in the regions δ0 and δ1 (S527). The degree of congestion in the target wiring layer in the computing is computed by dividing the degree of congestion by the number of unit regions γ present in the region δ.

The semiconductor design apparatus 2 may determine whether or not the degree of congestion has been computed in all the target wiring layers in the computing (S528). If a result of the determination shows that the degree of congestion has not been computed in all the target wiring layers in the computing (FAIL in S528), the semiconductor design apparatus 2 may update the wiring layer in which the degree of congestion is computed and proceed to the process in step S522. On the other hand, if the result of the determination shows that the degree of congestion has been computed in all the target wiring layers in the computing (PASS in S528), the semiconductor design apparatus 2 may sum the degrees of congestion in all the target wiring layers in the computing, update the degree of congestion to the result of the summation (S529), complete the calculation of the degree of congestion in the wiring layers, and return back to the main procedure.

Figure 6:
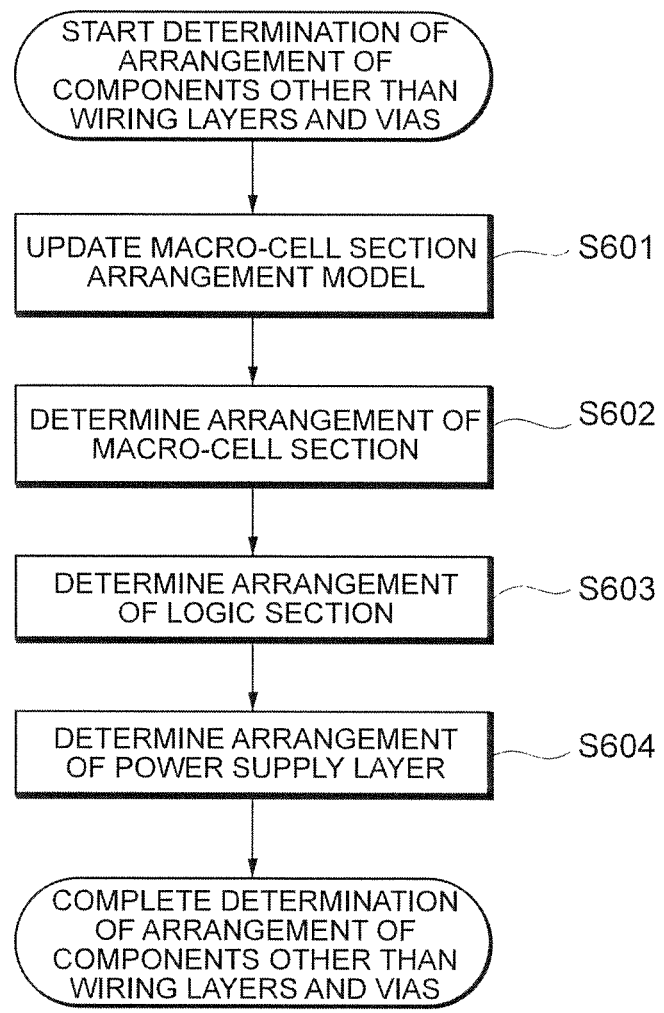
FIG. 6 is a flowchart for schematically describing the method for designing a semiconductor device according to one or more embodiments of the present invention.

FIG. 6 is a flowchart for schematically describing the method for designing a semiconductor device according to one or more embodiments of the present invention and shows the process in step S403 in FIG. 4 in detail.

The semiconductor design apparatus 2 may update the macro cell region arrangement model 10a based on the region β, where the power supply straps 11 are disposed in the macro cell region 10. That is, the semiconductor design apparatus 2 may arrange power supply straps 11a in the macro cell region arrangement model 10a based on the determined region β, and the semiconductor design apparatus 2 may further change the macro cell region arrangement model 10a to the thus determined macro cell region arrangement model (S601). The semiconductor design apparatus 2 may then determine an arrangement of the macro cell region 10 in the semiconductor device 1 based on the updated macro cell region arrangement model 10a (S602).

The semiconductor design apparatus 2 may determine an arrangement of the logic region 20 in the semiconductor device 1 based on the determined arrangement of the macro cell region 10 in the semiconductor device 1 (S603). The semiconductor design apparatus 2 may subsequently determine an arrangement of the power supply layer 50 in the semiconductor device 1 based on the determined arrangements of the macro cell region 10 and the logic region 20 in the semiconductor device 1 (S604).

FIG. 7 is a block diagram showing an example of a schematic hardware configuration of the semiconductor design apparatus according to one or more embodiments of the present invention. A computing device that forms the semiconductor design apparatus 2 described above may typically comprise one or more processor modules 701, a chip set 702, a memory module 703, a storage device 704, an I/O controller 705, and a variety of peripheral interfaces 706, as shown in FIG. 7, but may not be limited thereto.

The processor module 701 may comprise, for example, a processor core, a micro-controller, a digital signal processor, and/or a combination thereof but may not be limited thereto. The term "processor core" may be used herein as a synonym of a processor that means a main processor, a CPU, and an MPU. The processor module 701 may comprise a primary-level or higher-level cache mechanism.

The chip set 702 may be formed of a circuit in which a bridge to a bus that connects, for example, the processor module 701, the memory module 703, the storage device 704, and the I/O controller 705 to each other and other components necessary to configure the computing device are integrated with each other. The chip set 702 may be controlled, for example, by the processor module 701.

The memory module 703 may typically be a primary storage section formed of a volatile memory (RAM, for example), a nonvolatile memory (e.g., ROM and flash memory), and/or a combination thereof. The memory module 703 may typically store the entirety or part of a device driver, an operating system (OS) program, one or more application programs, program data, and other types of information that may be used by the processor module 701. According to one or more embodiments of the present invention, a design program for achieving the design method described above may be held as one of the application programs in the memory module 703.

The storage device 704 may typically be configured, for example, of a hard disk drive (HDD), an optical disk drive, a solid-state device (SSD). The storage device 704 may function as a secondary storage section used by the processor module 701 and store the OS, the application programs, the program data, and a variety of databases.

The I/O controller 705 may be a circuit that efficiently controls communication with the variety of peripheral interfaces 706 (e.g., output interface 706a, I/O interface 706b, and communication interface 706c). The output interface 706a may, for example, comprise a graphic board and a sound board and controls the operation of an external output device, such as a display and a loudspeaker. The I/O interface 706b may, for example, comprise a serial controller or a parallel controller and controls the operation of a variety of input devices and other peripheral devices. The I/O interface 706b may, for example, comprise a PCI interface, a USB interface, an IEEE 1394 interface, a Thunderbolt interface, and a fiber channel but may not be limited thereto. The communication interface 706c may be a circuit that allows communication, for example, with a node of another computing device. The communication interface may, for example, comprise an Ethernet (registered trademark) circuit. Network communication may be performed in the form of wired or wireless communication.

As described above, in the method for designing the semiconductor device 1 according to one or more embodiments of the present invention, the semiconductor design apparatus 2 may determine the regions α0 and α1 provided on both sides of the one-side end portion of the macro cell region 10 based on the consumption current Im in the macro cell region 10 and the acceptable current Ic per via 30 and further determine the region β, where the power supply straps 11 are provided in the macro cell region 10. Further, in the method for designing the semiconductor device 1 according to one or more embodiments of the present invention, the semiconductor design apparatus 2 may determine to dispose the vias 40 and the wiring layers 60 and 70 above the thus provided regions α0 and α1 to solve congestion of signal wiring lines that occurs in a portion around the macro cell region 10, whereby the chip area of the semiconductor device 1 and the number of wiring layers can be reduced.

The above-described embodiments are merely examples for explaining the present invention and are not intended to limit the present invention. The present invention can be achieved in various forms without departing from the scope of the present invention.

For example, in the method disclosed in the present specification, the steps, operations, or functions may be performed concurrently or in different orders as long as the results cause no contradiction. The steps, operations, and functions described above have been provided only by way of example, and some of the steps, operations, and functions can be omitted or combined with each other into a single step, operation, or function, or other steps, operations, or functions may be added to the extent that the omission, combination, and addition do not depart from the substance of the present invention.

Further, in the present specification, in which a variety of embodiments have been disclosed, a specific feature (technical item) in an embodiment can be improved as appropriate and the improved feature can be added to another embodiment or can replace a specific feature in the another embodiment. These aspects fall within the substance of the present invention.

Furthermore, certain "units" described above may be implemented by a circuit and/or a processor using known methods.

The present invention can be widely used in a field of semiconductor integrated circuits. Thus, various changes may be made to the above embodiments without departing from the scope of the present invention. While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:
1. A semiconductor device comprising:
   a macro cell region formed by at least one cell circuit;
   a power supply layer configured to supply electric power to the macro cell region through vias; and
   a wiring layer for signal communication,
   wherein the macro cell region comprises a plurality of power supply straps that extends in a direction from a one-side end portion toward an other-side end portion of the macro cell region, and
   wherein at least two of the plurality of power supply straps are arranged such that front-end portions thereof form an echelon pattern on an upper surface on at least one end of the one-side end portion of the macro cell region to form a predetermined region for the wiring layer.

2. The semiconductor device according to claim 1, wherein the at least two of the plurality of power supply straps that form the echelon pattern are arranged such that the front-end portions thereof are recessed stepwise in a region from a central portion of the one-side end portion of the macro cell region toward a side comprising the at least one end.

3. The semiconductor device according to claim 1, further comprising:
   a logic region arranged around the macro cell region,
   wherein the wiring layer is provided in at least one of a position between the logic region and the power supply layer and a position between the predetermined region and the power supply layer.

\* \* \* \* \*